United States Patent [19]
Kong et al.

[11] Patent Number: 5,200,022
[45] Date of Patent: Apr. 6, 1993

[54] METHOD OF IMPROVING MECHANICALLY PREPARED SUBSTRATE SURFACES OF ALPHA SILICON CARBIDE FOR DEPOSITION OF BETA SILICON CARBIDE THEREON AND RESULTING PRODUCT

[75] Inventors: Hua-Shuang Kong, Raleigh; Calvin H. Carter, Jr., Cary, both of N.C.

[73] Assignee: Cree Research, Inc., Durham, N.C.

[21] Appl. No.: 592,548

[22] Filed: Oct. 3, 1990

[51] Int. Cl.$^5$ .................. C30B 25/02; C30B 29/36
[52] U.S. Cl. .................. 156/612; 437/100; 437/93; 437/946; 156/613; 156/DIG. 64; 156/DIG. 68; 148/DIG. 148
[58] Field of Search ....... 156/610, 612, 613, DIG. 64, 156/DIG. 68; 437/81, 126, 133, 946, 970, 93, 100; 148/DIG. 148

[56] References Cited

U.S. PATENT DOCUMENTS

| | | | |
|---|---|---|---|
| 3,698,944 | 10/1972 | Dyer | 156/612 |
| 3,956,032 | 5/1976 | Powell et al. | 156/610 |
| 4,855,254 | 8/1989 | Eshita et al. | 156/612 |
| 4,866,005 | 9/1989 | Davis et al. | 437/100 |
| 4,912,063 | 3/1990 | Davis et al. | 437/100 |
| 4,912,064 | 3/1990 | Kong et al. | 437/100 |
| 4,987,094 | 1/1991 | Colas et al. | 437/81 |

OTHER PUBLICATIONS

Kong et al.; An examination of double positioning boundaries and interface misfit in beta-SiC films on alpha-SiC substrates; J. Appl. Phys. 63(8), Apr. 15, 1988; pp. 2645-2650.

Will et al.; Improved Epitaxial Process for Fabricating Silicon Carbide Semiconductor Devices; Solid State Technol. Apr. 1975, vol. 18, No. 4, p. 70.

Zheng et al.; Scanning tunneling microscopy of cubic silicon carbide surfaces J. Vac. Sic. Technol. A, vol. 6, No. 3, May/Jun. 1988; pp. 696-698.

Palmour et al.; Characterization of device parameters in high-temperature metal-oxide-semiconductor field-effect transistors in $\beta$-SiC thin films; J. Appl. Phys. 64(4), Aug. 15, 1988; pp. 2168-2177.

Yoshida et al.; A new doping method using metalorganics in chemical vapor deposition of 6H-SiC; J. Appl. Phys. 55(1), Jan. 1, 1984; pp. 169-171.

Pilyankevich, et al.; Change in Real Structure During the $\beta \rightarrow \alpha$ SiC Conversion; 1984 Plenum Publishing Corporation; 1557-1559.

Kong et al.; Chemical vapor deposition and characterization of 6H-SiC thin films on off-axis 6H-SiC substrates; J. Appl. Phys. 64(5), Sep. 1, 1988; pp. 2672-2679.

Kuroda et al.; Step-Controlled VPE Growth of SiC Single Crystals at Low Temperatures; Extended Abstracts of the 19th Conference on Solid State Dev. and Mat. Tokyo, 1987; pp. 227-230.

Bauser et al.; A lateral microscopic growth model for heterogeneous impurity incorporation during Czochralski crystal growth; Appl. Phys. Lett., vol. 37, No. 11, Dec. 1, 1980; pp. 1001-1003.

Kong et al.; Growth and Characterization of Chemically Vapor Deposited Beta-SiC Epilayers on 6H Alpha-SiC Substrates; Mat. Res. Soc. Symp. Proc. vol. 77, 1987 pp. 405-410, Mat. Res. Soc. Symposium D, Dec. 1986.

Kim et al.; Chemical Vapor Deposition, In Situ Doping and MESFET Performance of Beta-SiC Thin Films; Ceramic Transactions, vol. 2, pp. 457-477 (1989).

(List continued on next page.)

*Primary Examiner*—Mary Wilczewski
*Attorney, Agent, or Firm*—Bell, Seltzer, Park & Gibson

[57] ABSTRACT

The invention is a method of improving a mechanically prepared surface of alpha silicon carbide for increasing the polytype purity of an epitaxial layer of beta silicon carbide grown thereon. The method comprises decreasing the frequency of exposed higher energy lattice positions along a mechanically prepared {0001} surface of a 6H alpha silicon carbide substrate by adding atoms to vacant lattice positions and by increasing the average height and separation between steps on a mechanically prepared {0001} surface of 6H silicon carbide.

4 Claims, 6 Drawing Sheets

OTHER PUBLICATIONS

Muench et al.; Epitaxial Deposition of Silicon Carbide From Silicon Tetrachloride and Hexane; Thin Solid Films 31 (1976); pp. 39–51.

Liaw et al.; Epitaxial Growth and Characterization of $\beta$-SiC Thin Films; J. Electrochem. Soc.; vol. 132, No. 3; Mar. 1985; pp. 642–648.

Minagwa et al.; Epitaxial Growth of $\alpha$-SiC from the Vapor Phase; Japanese J. of Appl. Phys., vol. 10, No. 12, Dec. 1971; pp. 1680–1690.

Nishino et al.; Growth and Morphology of 6H–SiC Epitaxial Layers by CVD; J. of Crystal Growth 45 (1978); pp. 144–149.

Wessels et al.; Epitaxial Growth of Silicon Carbide by Chemical Vapor Deposition; pp. 25–32.

Kong et al.; Growth rate, surface morphology, and defect microstructures of $\beta$-SiC films chemically vapor deposited on 6H–SiC substrates; J. Mater. Res., vol. 4, No. 1, Jan./Feb. 1989; pp. 204–214.

Kong et al.; The effect of off-axis Si (100) substrates on the defect structure and electrical properties of $\beta$-SiC thin films; J. Matter. Res. 3(3) May/Jun. 1988; pp. 521–530.

Saidov et al.; Current–voltage characteristics of silicon carbide heterojunctions; Sov. Phys. Semicond. 13(9), Sep. 1979; pp. 1054–1056.

Kong et al.; Growth, Doping, Device Development and Characterization of CVD Beta-SiC Epilayers on Si(100) and Alpha–SiC(0001); Novel Refractory Semiconductors, Mat. Res. Soc. Symposia, vol. 7, Apr. 1987.

Choudhury et al.; $\beta$–Silicon Carbide Films; J. Electrochem. Soc., vol. 116, No. 10, Oct. 1969; pp. 1440–1443.

Berman et al.; The Influence of Annealing on Thin Films of Beta SiC; Solid State Sciences Laboratory; Dec. 19, 1972; No. 522.

Bartlett et al.; Epitaxial Growth of $\beta$–Silicon Carbide; Mat. Res. Bull. vol. 4 pp. S 341–S 345.

Khan; The Epitaxial Growth of Beta Silicon Carbide; Mat. Res. Bull. vol. 4; pp. S 285–S 292, 1969.

Callaghan et al.; A New System for the Chemical Vapour Deposition of SiC; Journal of Crystal Growth 13/14 (1972); pp. 397–401.

Jennings et al.; The Epitaxial Growth of Silicon Carbide; J. of the Electrochem. Soc.; Jul. 1966; vol. 113, No. 7; pp. 728–731.

Yoshida et al.; Abstract-Heteroepitaxial Growth of SiC Polytypes.

Kaneda et al.; MBE Growth of 3C·SiC/6H·SiC and the Electric Properties of its p–n Junction; J. of Crystal Growth 81 (1987); pp. 536–542.

Kong et al.; Epitaxial growth of $\beta$–SiC thin films on 6H $\alpha$–SiC substrates via chemical vapor deposition; Appl. Phys. Lett. 49(17), Oct. 27, 1986; pp. 1074–1076.

METHOD OF IMPROVING MECHANICALLY PREPARED SUBSTRATE SURFACES OF ALPHA SILICON CARBIDE FOR DEPOSITION OF BETA SILICON CARBIDE THEREON AND RESULTING PRODUCT

This invention was made with Government support under Department of the Navy Contract No. N00014-90-C-0038. The Government was certain rights in this invention.

FIELD OF INVENTION

The present invention relates to the growth of epitaxial layers of silicon carbide, and in particular relates to the production of epitaxial layers of beta silicon carbide on substrates formed of alpha silicon carbide.

BACKGROUND

Silicon carbide has long been a candidate material for use in electronic devices, particularly those intended for high temperature, high power, and high frequency use. Silicon carbide has an extremely high melting point, a relatively large energy bandgap, a high saturated electron drift velocity, a high breakdown field strength, a high thermal conductivity, and superior chemical resistance. Its large energy bandgap also makes it an excellent material for use in radiation intensive environments.

Although silicon carbide is the only compound species in the Si-C system, it occurs in many polytype structures. Most of these polytypes are separated by relatively small thermodynamic differences. Approximately 170 of these polytypes are of the hexagonal and rhombohedral classifications and are collectively referred to as "alpha" silicon carbide ($\alpha$-SiC), the most common of which is the 6H hexagonal polytype. The lone cubic polytype crystallizes in the zinc blend structure and is referred to as "beta" silicon carbide ($\beta$-SiC).

Beta silicon carbide has long been considered as a theoretically excellent semiconductor material, particularly because its electron mobility is postulated to be higher than that of alpha silicon carbide throughout its useful temperature range. Additionally, for various growth techniques—and in particular for chemical vapor deposition —the growth temperatures suitable for beta silicon carbide are generally lower than those for the alpha forms. Nevertheless, the difficulties encountered in attempting to grow high quality, low carrier concentration beta silicon carbide epitaxial layers (also referred to as "epilayers" or "thin films") have tended to prevent beta silicon carbide from reaching, on a practical and commercial level, the full potential that its properties would theoretically indicate.

More recently, however, significant progress has been made in the growth of beta silicon carbide thin films on alpha silicon carbide substrates. In particular, U.S. Pat. No. 4,912,063 to Davis et al. discloses significant improvements in the growth of beta silicon carbide thin films on alpha silicon carbide substrates. The contents of U.S. Pat. No. 4,912,063 are incorporated entirely herein by reference. In particular, the '063 patent discusses the advantages of forming beta silicon carbide thin films on alpha silicon carbide, rather than on silicon, as had been the main focus of the such research up to that point; see e.g. U.S. Pat. Nos. 4,762,806 and 4,757,028 to Suzuki et al. and Kondoh et al. respectively.

The work discussed in the '063 Patent, although particularly significant in advancing this technology, generally focuses upon beta silicon carbide thin films formed on the naturally occurring surfaces of 6H alpha silicon carbide crystals formed in an Acheson furnace in a manner familiar to those of ordinary skill in this art. As used herein, a "natural" face is one that has occurred through crystal growth. A "non-natural," "industrial," or "mechanically prepared" surface is one obtained through means other than growth, for example by separating a crystal along a particular plane, and then producing a smooth surface by the usual steps of lapping and polishing.

A natural $\alpha$-SiC growth surface, when available, generally provides a preferred foundation for crystal growth of the beta polytype. A bulk crystal of beta silicon carbide would theoretically be ideal, but to date successful growth of relatively large bulk crystals of the beta polytype remains elusive. Additionally, an $\alpha$-$\beta$ heterojunction is desired for some devices, so that techniques for epitaxial growth of beta on alpha remain important in this field. As discussed in the '063 Patent, the preferred method of crystal growth is on one of the {0001} surfaces of such a 6H crystal, which may be either the (0001) silicon face or the (0001) carbon face. The (111) surface of $\beta$-SiC offers an almost perfect match of both lattice parameter and coefficient of thermal expansion with the (0001) surface of 6H $\alpha$-SiC. In contrast, there is an approximate 20 percent lattice mismatch between $\beta$-SiC and silicon. Therefore, when a (0001) surface of $\alpha$-SiC is used as a substrate, and growth conditions are otherwise tailored for $\beta$-SiC, the growth of the beta polytype upon the alpha substrate is favored.

The Miller index designations set forth above and elsewhere herein are used with their standard meanings; see e.g. S.M. Sze, *Semiconductor Devices— Physics and Technology*, pages 3-7, section 1.2 (1985).

Although Acheson or other "natural" faced silicon carbide crystals offer favorable surfaces for further crystal growth thereon, and particularly for thin films, the size of available SiC crystals has historically been limited by the difficulties inherent in attempting to grow a large single crystal of silicon carbide of a desired polytype, given the plurality of polytypes available and the small thermodynamic differences between them. Recently, however, significant progress also has been made in the sublimation growth of bulk single crystals of silicon carbide. This technique and the associated results are discussed in U.S. Pat. No. 4,866,005. The results of this progress have been to provide larger bulk single crystals of silicon carbide of high quality and sizes never before available, and consequently suitable for a number of applications.

One such appropriate application is to use such large bulk crystals as a source of correspondingly large individual substrate wafers of silicon carbide suitable for device manufacture. As known by those familiar with substrate manufacture, in order to form such wafers, a bulk single crystal is typically sliced along a desired crystal plane and then lapped and polished to form a surface suitable for epitaxial growth thereon.

A technical problem arises, however, in the growth of beta silicon carbide thin films on alpha silicon carbide substrates. As discussed above and in the '063 Patent, an appropriate lattice match can be made between alpha silicon carbide and beta silicon carbide when a (0001) face of the alpha silicon carbide is exposed and beta silicon carbide is deposited in a manner so that the (111) crystallography of the beta silicon carbide thin film matches the (0001) crystallography of the alpha silicon carbide substrate. When the (0001) face of the alpha substrate is a naturally occurring face, the growth of beta silicon carbide thereon is rather straightforwardly possible. Nevertheless, as the technology of large wafers of silicon carbide cut from bulk crystals has developed further, it has been discovered that when the alpha substrate includes a non-natural (0001) face that has been mechanically prepared, the more likely tendency is for alpha silicon carbide to grow on the alpha substrate. As a result, when such mechanically prepared wafers are used as substrates for thin film growth of $\beta$-SiC, the resulting films are often unsuitable mixtures of the alpha and beta polytypes. Therefore, such successful growth of bulk crystals of silicon carbide has raised the need for thin film growth processes that take full advantage of the availability of such large, high quality silicon carbide crystals.

The reasons for this are apparently related to the nature of crystal structure and crystal growth. As is known by those familiar with these concepts and characteristics, the repetitive growth of a crystal depends upon the transmission of information from the crystal to the atoms or molecules that are being added to it as it grows. The growing portions of a crystal tend to inherit the existing lattice or "stacking" characteristics of the crystal. The growth face for certain crystallographic planes, however, sometimes have perfectly planar surfaces. Such perfect surfaces may not tend to transmit certain crystallographic information to atoms or molecules that come in contact with them as well as do surfaces having features on the surface, such as those features generally referred to as "steps." Therefore, where steps exist, they often provide positions along a crystal face at which crystallographic information is transmitted as atoms or molecules are added to the crystal.

In a naturally occurring (0001) face of alpha silicon carbide, the number of such steps is relatively few and they are geometrically relatively far apart. Thus, there are relatively few positions at which the alpha silicon carbide substrate can transmit information to added atoms of silicon or carbon that would encourage them to continue to form alpha silicon carbide. Accordingly, under appropriate growth conditions, and because of the lattice match, the growth of beta silicon carbide upon such a natural alpha silicon carbide surface can be encouraged, as set forth in the '063 Patent.

When, however, an alpha silicon carbide (0001) face is mechanically prepared, it is rarely possible to prepare it exactly along the (0001) face. Consequently, many more steps are present along the surface. These steps tend to encourage additional atoms of carbon and silicon to add to the alpha substrate in the alpha crystallographic lattice, even under conditions which would otherwise favor the growth of beta silicon carbide. Stated differently, the growing layers tend to follow the stacking sequences of the substrate. The result is that when a mechanically prepared (0001) surface of alpha silicon carbide is used as a substrate for epitaxial deposition of beta silicon carbide thereon, the resulting layer is often an unsatisfactory mixture of alpha and beta polytypes. In turn, the resulting thin film often lacks utility for those electronic applications for which substantially pure polytype beta silicon carbide is desired.

Therefore, most successful growth of beta silicon carbide thin films on 6H alpha silicon carbide substrates has to date been limited to growth upon naturally occurring (0001) surfaces. As stated earlier, however, because of the recent success in growing relatively large bulk crystals of 6H alpha silicon carbide, it would be most desirable if such large crystals could be sliced into large wafers upon which beta silicon carbide thin films could be successfully grown, so that larger wafers, larger devices, and larger numbers of devices can be appropriately and successfully formed.

OBJECT AND SUMMARY OF THE INVENTION

Therefore, it is an object of the invention to provide a method for the growth of epitaxial layers of beta silicon carbide of extremely pure polytype composition on substrates of alpha silicon carbide, particularly where the substrates are mechanically prepared.

The invention meets this object by providing a method of improving a mechanically prepared surface of alpha silicon carbide by decreasing the frequency and energy of exposed higher energy lattice positions along a mechanically prepared {0001} surface of an alpha silicon carbide substrate.

In another embodiment, the invention comprises a method of growing epitaxial layers of beta silicon carbide on mechanically prepared surfaces of silicon carbide.

In an additional embodiment, the invention comprises a surface of silicon carbide that encourages the growth of beta silicon carbide thereon under growth conditions for which beta silicon carbide is favored.

In yet another embodiment, the invention comprises a device precursor for devices formed in beta silicon carbide.

The foregoing and other objects, advantages and features of the invention, and the manner in which the same are accomplished, will become more apparent upon consideration of the following detailed description of the invention taken in conjunction with the accompanying drawings, which illustrate preferred and exemplary embodiments, and wherein:

DETAILED DESCRIPTION OF THE PREFERRED EMBODIMENTS

In its most fundamental embodiment, the present invention is a method of improving a mechanically prepared surface of alpha silicon carbide for increasing the polytype purity of an epitaxial layer of beta silicon carbide grown thereon by decreasing the frequency and energy of exposed higher energy lattice positions, such as steps that transmit three-dimensional lattice information, along a mechanically prepared {0001} surface of an alpha silicon carbide substrate.

Figure 1:
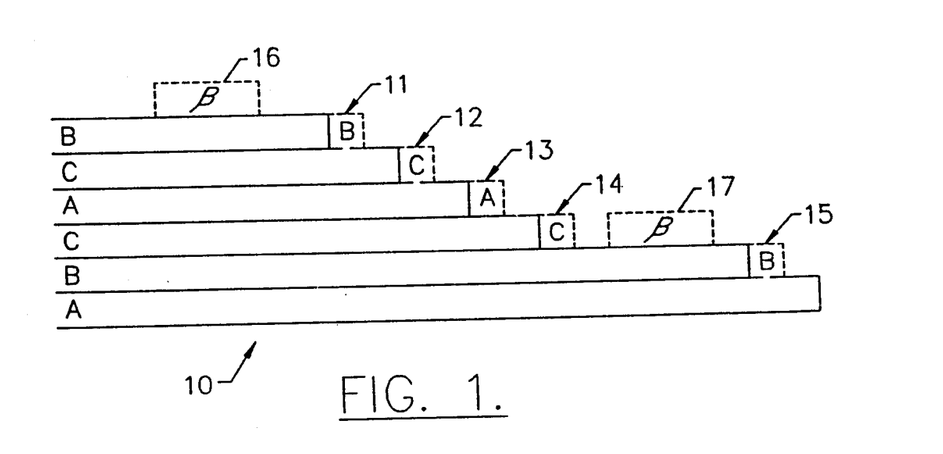
FIG. 1 is a schematic drawing of a silicon carbide crystal lattice for which the present invention has not been incorporated.
Figure 2:
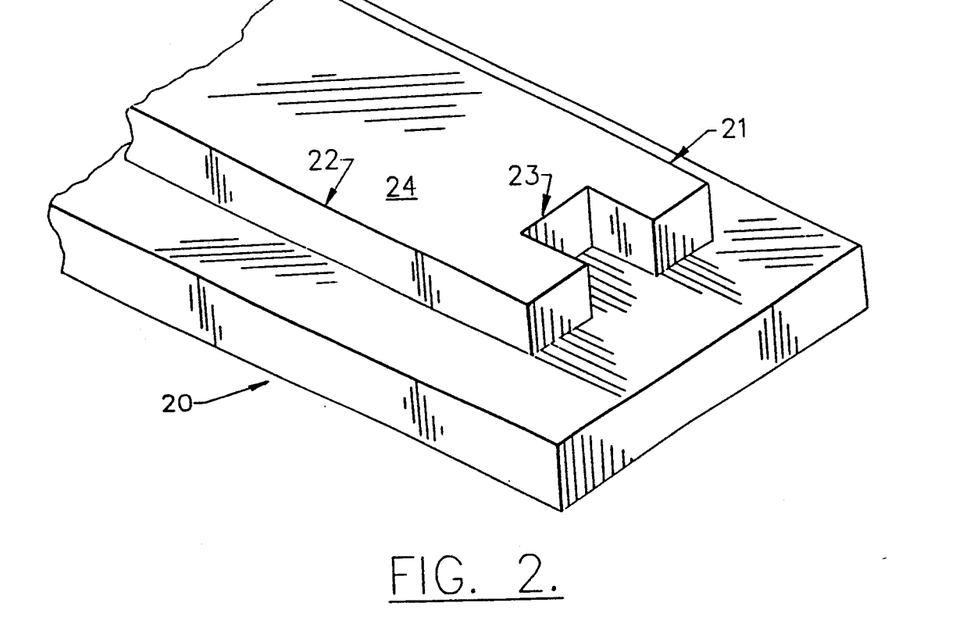
FIG. 2 is partial perspective schematic diagram similar to that of FIG. 1.

In this regard, FIGS. 1 and 2 schematically illustrate certain features of crystal growth to which this invention is addressed. FIG. 1 is a plan view taken along a surface of a 6H alpha silicon carbide substrate broadly designated at 10. Layers of unit cells adjacent the surface are designated A, B, and C in a conventional stacking nomenclature familiar to those of ordinary skill in the crystallographic arts. As indicated in FIG. 1, a 6H substrate 10 grows in layers of unit cells in the order ABCACB.

FIG. 1 schematically demonstrates that where the {0001} surface of 6H silicon carbide is mechanically prepared, there are a relatively large number of discontinuous portions in the respective B, or C layers. Because of their appearance, these discontinuities are generally referred to as "steps". Five such steps are shown in FIG. 1 and are broadly designated at 11 through 15 respectively.

From a thermodynamic standpoint, steps such as those illustrated at 11 through 15 are characterized as "high energy" positions, referring to their potential energy. From a practical standpoint, this characterization means that the elimination of such steps is generally thermodynamically favored as a means of lowering the overall potential energy of the crystal. As those familiar with thermodynamics are aware, lowering potential energy or other energy content is the natural tendency of chemical reactions. Indeed, many phenomena in nature can be best explained by a driving force consisting of the effort to lower potential energy or energy content.

FIG. 1 also illustrates the natural growth tendency of a crystal; namely, the existence of the five steps 11 through 15 provides five at which 6H silicon carbide will tend to reproduce itself as the crystal grows, even though the chemical vapor deposition of growth conditions might well be otherwise more favorable for the growth of beta silicon carbide. As illustrated in FIG. 1, further growth at step 11 will be of a B-type layer corresponding to the existing B-type layer; at step 12, C corresponding to at step 13, A corresponding to A; at step 14, C corresponding again to C; and at step 15, B corresponding again to B.

Alternatively, FIG. 1 also illustrates that where steps are nonexistent or relatively far apart, and again incorporating growth conditions that are otherwise thermodynamically favorable for the growth of beta silicon carbide, such beta silicon carbide will nucleate and grow on the alpha silicon carbide layers because of the favorable lattice match referred to earlier. For schematic purposes two such areas are illustrated in FIG. 1 at 16 and 17. FIG. 1 thus illustrates in schematic fashion that if the various layers could be lengthened to decrease the number of steps and increase the distance between them, the result would be a greater number of open uninterrupted layers of alpha exposed, and upon which the growth of beta silicon carbide would significantly surpass that of alpha silicon carbide.

FIG. 2 is another schematic view of several layers along the surface of a 6H alpha silicon carbide substrate broadly designated at 20. FIG. 2 also illustrates steps, and shows that they can occur in several directions such as those broadly designated at 21 and 22. FIG. 2 illustrates an additional feature, however, referred to as a "kink" and which is shown as the indented portion 23 in the upper layer illustrated in FIG. 2. A kink also represents a relatively high energy position and a kink such as that illustrated at 23 is particularly high because of the large number of lattice positions that border it. These are schematically illustrated as its various sides and corners. These may also be thought of as "dangling valances"; i.e. positions where the next chemical bond will preferably form accompanied by a release of potential energy.

Thus, FIG. 2 illustrates that during deposition conditions which are favorable for the growth of beta silicon carbide, such beta silicon carbide would be likely to grow on relatively smooth surfaces of 6H silicon carbide such as the uppermost surface 24 illustrated in FIG. 2. Alternatively, along the steps 21 and 22, and adjacent to the kink 23, the large number of high energy lattice positions, and the crystallographic information of 6H characteristics that they transmit, will tend to encourage the corresponding growth of 6H silicon carbide.

In terms of the crystal structure schematically illustrated in FIG. 1, the removal of such positions is generally accomplished by either crystal growth, i.e. by adding atoms to vacant lattice positions, or crystal removal, i.e. removing atoms until such higher energy positions are fewer and farther between. Thus, in its most basic embodiment, the invention comprises improving a mechanically prepared alpha silicon carbide surface by decreasing the frequency of exposed higher energy lattice positions (such as steps 11-15, 21 and 22, and vacant lattice positions such as kink 23) along a mechanically prepared (0001) surface of a 6H alpha silicon carbide substrate.

STEP POISONING

In a first particular embodiment, the method of improving the mechanically prepared surface is a "step poisoning" technique. The method comprises introducing atoms into such vacant lattice positions along the surface of a basal plane of an alpha silicon carbide substrate to thereby prevent the vacant lattice positions from encouraging the repetitive growth of alpha silicon carbide at those lattice positions so that chemical vapor deposition conditions that are otherwise favorable for epitaxial growth of beta silicon carbide upon the basal plane will result in such growth of beta silicon carbide upon the alpha silicon carbide substrate.

More preferably, the method comprises introducing atoms into vacant lattice positions of a mechanically prepared (0001) surface of alpha silicon carbide, and most preferably comprises introducing atoms of an element other than silicon or carbon, for example aluminum, gallium, or phosphorous.

From a functional standpoint, the type of atom added to the step should have several appropriate characteristics. First, it should be harmless to devices later formed on the epitaxial layer. Such atoms should either not dope, or if they are dopants, should dope desirably; e.g. aluminum for p-type doping. Additionally the atoms should be of a size to be absorbed on the kinks or steps without substantially disturbing the overall lattice, or interfering with its later growth.

In this regard, the invention further comprises a method of growing epitaxial layers of beta silicon carbide on such non-natural or mechanically prepared surfaces of alpha silicon carbide that first comprises the step of separating a bulk single crystal of alpha silicon carbide into a substrate crystal with at least one of the {0001} surfaces thereof exposed. Atoms other than silicon or carbon are then introduced into the vacant lattice positions along the steps on the (0001) surface as stated previously, following which the (0001) surface is exposed to carbon containing and silicon containing species under conditions for which the growth of beta silicon carbide is thermodynamically favored for a time sufficient for a desired epitaxial layer of beta silicon carbide to form upon the (0001) surface of the silicon carbide substrate.

In preferred embodiments, and as is quite useful in the manufacture of semiconductor devices, the step of separating the bulk crystal can comprise slicing a bulk crystal into individual wafers and then lapping and polishing the exposed surface as may be desired.

In a more preferred embodiment, the step of exposing the (0001) surface to carbon containing and silicon containing species can comprise exposing the (0001) face of the substrate so that a beta silicon carbide thin film is deposited in the [111] growth direction on the (0001) surface such that the (111) crystallography of the beta silicon carbide thin film matches the (0001) surface of the substrate and such that the beta silicon carbide (101) face is parallel to the alpha silicon carbide (1120) face and the beta silicon carbide (111) face is parallel to the alpha silicon carbide (0001) face.

The chemical vapor deposition conditions under which the growth of beta silicon carbide is favored are generally well-known from the thermodynamic data available for silicon carbide, and specific conditions can be tailored as necessary without undue experimentation. In particular, U.S. Pat. No. 4,912,063 sets forth a number of parameters under which an epitaxial layer of silicon carbide can be formed upon an appropriate alpha silicon carbide substrate. As mentioned previously, in the '063 patent the processes focused upon the use of naturally occurring 6H silicon carbide surfaces, and the present invention now provides the opportunity for the same success using mechanically prepared surfaces.

STEP BUNCHING

In another embodiment, the present invention comprises a method of improving a mechanically prepared surface of alpha silicon carbide for the growth thereon of a beta silicon carbide epitaxial layer by increasing the average height of and separation between surface steps on a (0001) surface of an alpha silicon carbide substrate, and preferably comprises increasing the average height of and separation between surface steps along a mechanically prepared 6H (0001) surface.

In this regard, the invention takes advantage of the characteristic of crystal growth that the speed or rate of lateral growth of steps with smaller heights exceeds the speed of lateral growth of steps with greater height. In other words, the speed with which a step grows laterally is inversely proportional to its height. As a result, during crystal growth smaller steps catch up and merge with higher steps in a process referred to as "step bunching." If the process is carried on successfully for a sufficient period of time, many smaller steps will merge into steps that are large enough to be particularly suitable for $\beta$-SiC nucleation during a later epitaxial growth process. In some cases, and depending on other factors, the steps will grow large enough to be visible on the surface of the epitaxial layer, particularly with the aid of moderate magnification.

Therefore, in this embodiment, the invention further comprises a method of growing epitaxial layers of beta silicon carbide on non-natural or mechanically prepared surfaces of alpha silicon carbide which comprises separating a bulk single crystal of alpha silicon carbide into a substrate crystal with at least one of the {0001} surfaces thereof exposed, increasing the average height of and separation between surface steps on the exposed (0001) surface of the alpha silicon carbide substrate, and exposing the (0001) surface to carbon containing and silicon containing species under conditions for which the growth of beta silicon carbide is thermodynamically favored for a time sufficient for a desired epitaxial layer of beta silicon carbide to form upon the (0001) surface of the silicon carbide substrate.

In a preferred embodiment, the step of increasing the average height and separation of steps is a sublimation growth step that adds 6H SiC to the mechanically prepared 6H surface. The step comprises placing the exposed (0001) surface in a sublimation system that includes a silicon carbide sublimation source, heating the silicon carbide source to a temperature at which silicon carbide will sublime from the source, and heating the exposed surface to a temperature approaching the temperature of the silicon carbide source, but below the temperature at which silicon carbide will sublime under the conditions of the system and for a time sufficient for silicon carbide to sublime from the source until an epitaxial layer of alpha silicon carbide deposits upon the exposed surface. Stated differently, the goal of this particular embodiment is to use sublimation techniques to grow additional alpha silicon carbide upon the alpha silicon carbide surface. During the sublimation growth the step bunching phenomena takes place and decreases the frequency of exposed higher energy lattice positions such as steps and kinks along the mechanically prepared surface.

In another embodiment, the method of increasing the average height of and separation between surface steps comprises annealing the exposed surface to encourage atoms in the silicon carbide lattice along the surface to diffuse and seek non-step positions in the lattice that are thermodynamically favored compared to the step positions. This likewise reduces the number of steps along the surface and concurrently increases the average height of the steps and the distance between them. In preferred embodiments, this annealing step comprises heating the substrate wafer to a temperature of approximately 1800°-2300° C. for a time period of about 5-30 minutes in otherwise conventional annealing equipment.

In yet another embodiment, the method of increasing the average height of and separation between surface steps comprises heating the substrate at a temperature at which silicon carbide will sublime from the surface, rather than to it. In this embodiment, the atoms at the exposed higher energy positions will typically be the first to sublime as there exists a lesser potential energy barrier to their removal than to removal of atoms that are a more complete part of the overall lattice.

In each of these embodiments, it will be recognized that consistent with the invention, exposed higher energy lattice positions are either added to or removed to form a 6H (0001) surface in which the number of steps and kinks has been minimized.

In yet other embodiments, the step of increasing the average height of and separation between surface steps can comprise removing some of the high energy lattice positions through either chemical etching or electrolytic etching.

STEP POISONING PROCEDURE

In a typical example of the step poisoning procedure, a 6H alpha silicon carbide wafer is introduced into a CVD reaction chamber which is then heated to growth temperature; e.g. approximately 1350° to 1600° C. An aluminum containing gas such as trimethylaluminum (TMA, $(CH_3)_3Al$) is introduced into the chamber for a short period of time at growth temperature, for example about 20 seconds. Then silicon and carbon containing gases are introduced into the reaction chamber to form the epitaxial layer, at which time the flow of aluminum may be stopped or continued, depending upon whether p-type doping is desired in the resulting epitaxial layer.

STEP BUNCHING PROCEDURE

Figure 7:
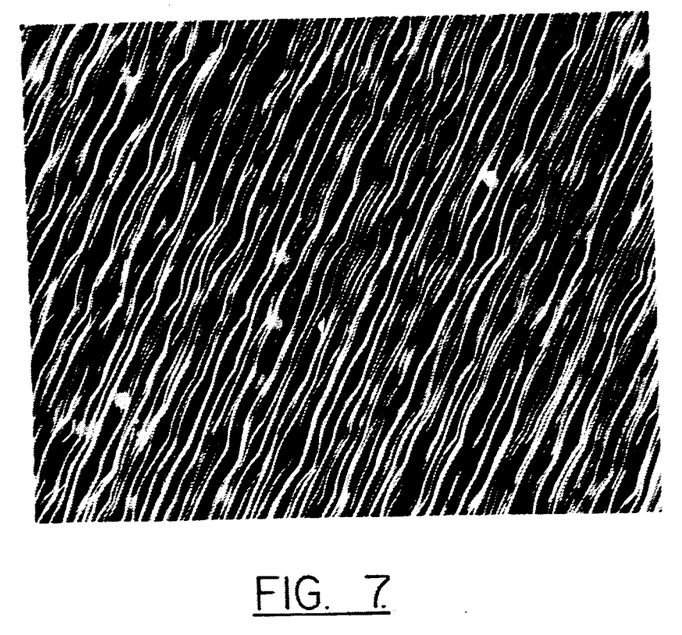
FIG. 7 is a 100× optical micrograph of a (0001) Si face of a 6H-SiC substrate following treatment according to the present invention.

In the step bunching method, a 6H-SiC (0001) Si face wafer was loaded into a sublimation growth furnace. A very thin epitaxial sublimation growth was performed, and resulted in a reduction of the number of steps to the point at which the remaining steps were large enough to be suitable for $\beta$-SiC nucleation and growth. FIG. 7 is a photograph of such a surface. As an example, while the growth of a bulk crystal of 6H silicon carbide would require on the order of 24 hours, a satisfactory epitaxial layer of 6H can be formed in about 1 hour under the same conditions. As set forth in U.S. Pat. No. 4,866,005 to Davis et al., appropriate temperature ranges for sublimation growth are between about 2250° C. and 2350° C. for the source and between about 2150° C. and 2250° C. for the substrate, and with the substrate temperature being kept lower than the source temperature. The resulting successful growth thereon of beta silicon carbide on such a prepared 6H substrate surface is reflected in FIGS. 8 and 9.

EPITAXIAL GROWTH PROCEDURE

A typical growth sequence following preparation of the surface according to the invention comprises a chemical vapor deposition system in which the substrate is placed on a susceptor and moved into a growth chamber. Once the susceptor and substrate are in place, the growth chamber is evacuated to a pressure at least as low as $10^{-4}$ torr, and preferably to $10^{-5}$ torr or less. Following evacuation, the growth chamber is back-filled for a relatively short period of time, usually about 10 minutes, with pure hydrogen ($H_2$) at a flow rate of about three liters per minute until 760 torr is reached. This step purges the system. Preferably the $H_2$ is at a purity of in excess of 99.99 percent prior to its introduction to the growth chamber. Such enhanced purity of the $H_2$ gas is typically accomplished by Pd-Ag purification techniques familiar to those skilled in these arts.

Following the purging step, the flow of hydrogen continues while a heating system, preferably a radio frequency (RF) induction electrode, heats the growth chamber to a temperature of approximately 1400° C. to about 1600° C., with temperatures of between about 1450° C. and 1550° C. preferred and a temperature of about 1550° C. most preferred.

If necessary, this growth temperature is held while the $H_2$ gas flow continues for a period sufficient to etch away any native oxide layer on the substrate surface. An $H_2$ etching period of approximately 10 minutes has been found sufficient to etch away approximately 10 angstroms of material.

When the etching step is completed, the $H_2$ gas flow is continued and serves as the carrier gas for the growth process. If so desired, the step poisoning technique may immediately follow, and then in turn immediately precede the epitaxial growth step.

A silicon containing source gas such as silane ($SiH_4$) and a carbon source gas, typically ethylene ($C_2H_4$) are introduced into the growth chamber in the flow of the hydrogen carrier gas. In a typical embodiment, the ratio of the sum of $SiH_4$ and $C_2H_4$ flow rates to the flow rate of $H_2$ was varied from 3:3000 to 1:3000 (sccm/sccm). The $SiH_4/C_2H_4$ flow rate ratio was maintained at 2. The source gases are preferably of very high purity with silane containing less than 2 ppm nitrogen impurities and the ethylene containing less than 10 ppm nitrogen impurities. The pressure in the growth chamber is held steady at approximately 760 torr.

Following a CVD growth period on the order of one to four hours, the heater can be turned off and the flow of source gases discontinued. A flow of hydrogen gas is allowed to continue for about the first 40 minutes of a cool down period which extends for a total of about one hour. The growth chamber is then filled with argon gas back to a pressure of about 760 torr, followed by removal of the susceptor and the substrate with the epitaxial layer of beta silicon carbide thereon.

Additionally, the CVD growth may be carried out using both the techniques of the present invention while incorporating the method and apparatus described in co-pending application Ser. No. 558,196, filed Jul. 24, 1990, by inventors Kong, Coleman and Carter, entitled "Method and Apparatus for Eliminating Nitrogen Contamination in Epitaxial Layers of Silicon Carbide and Resulting Product," which is assigned to the assignee of the present invention, and now U.S. Pat. No. 5,119,540.

Figure 3:
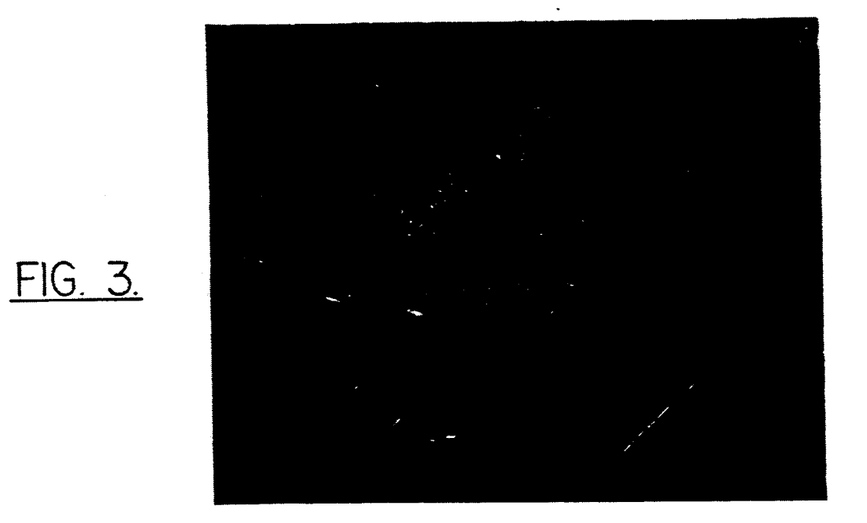
FIG. 3 is a 100× optical micrograph of an unetched, undoped 3C-SiC film grown on a 6H-SiC wafer, but without incorporating the present invention.
Figure 4:
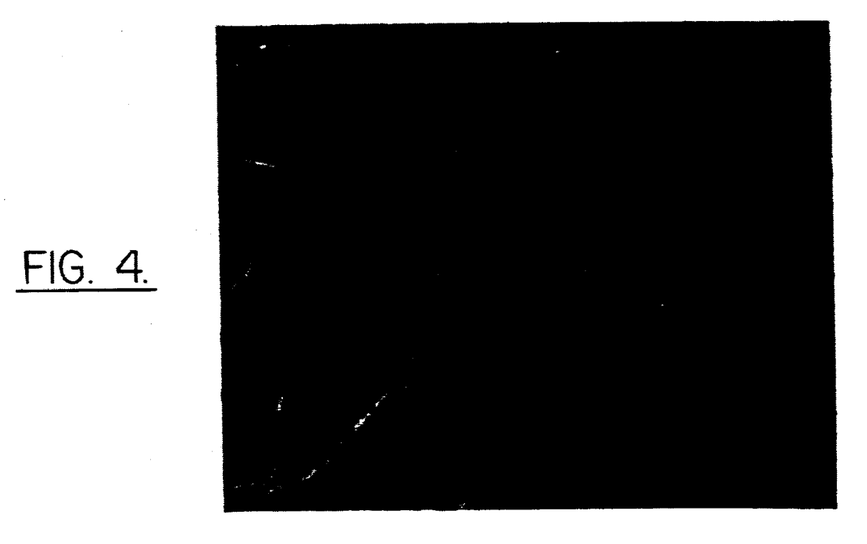
FIG. 4 is a 400× optical micrograph of the wafer of FIG. 3 following an etching step.

The remaining FIGS. are photographs which demonstrate the success achieved with the present invention. First, by way of comparison, FIGS. 3 and 4 show undoped beta silicon carbide thin films grown on substrate wafers that do not incorporate the present invention. FIG. 3 illustrates the surface as grown. FIG. 4 illustrates the same surface following a molten salt etch in potassium hydroxide (KOH) which is used to reveal the characteristic shape of certain defects (e.g. stacking faults and dislocations) so that the characteristics of the thin film can be more appropriately evaluated. In FIG. 4, the triangular etch pits are characteristic of $\beta$-SiC. Additionally, certain of the stacking faults can be observed as the dark lines intersecting one another at complimentary angles of 60° and 120° and which are characteristic of $\beta$-SiC. FIG. 4 also illustrates, however, that a relatively large number of hexagonal pits are also present, and these clearly demonstrate the presence of a significant amount of 6H silicon carbide in the 3C film. It is of course, this incorporation of 6H in 3C epitaxial layers that the invention prevents.

Figure 5:
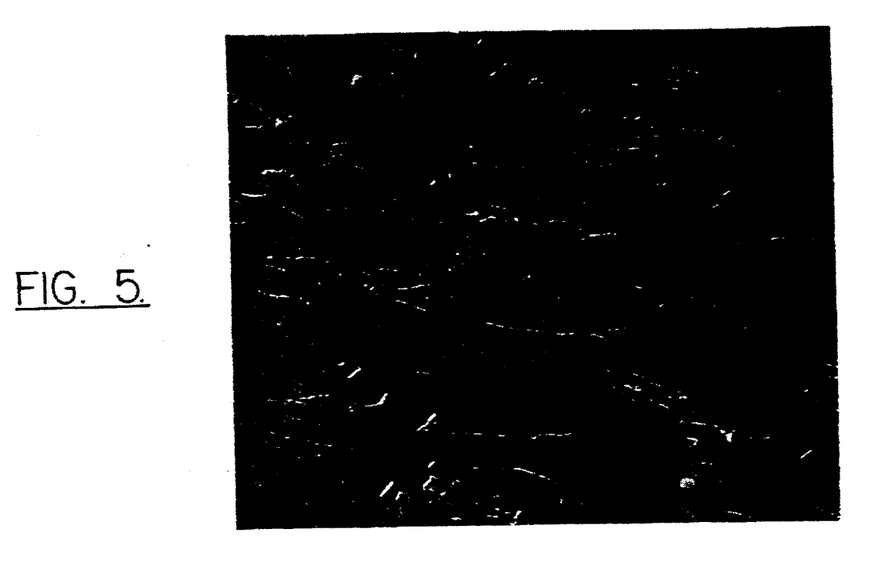
FIG. 5 is a 100× optical micrograph of the surface morphology of a beta-SiC film grown on a (0001) Si face of a 6H-SiC substrate using the present invention.

FIG. 5 is an as-grown surface of a beta silicon carbide thin film grown on an alpha silicon carbide wafer incorporating the step of the present invention in which atoms other than silicon or carbon are introduced into vacant lattice positions on the (0001) surface of the alpha silicon carbide substrate.

Figure 6:
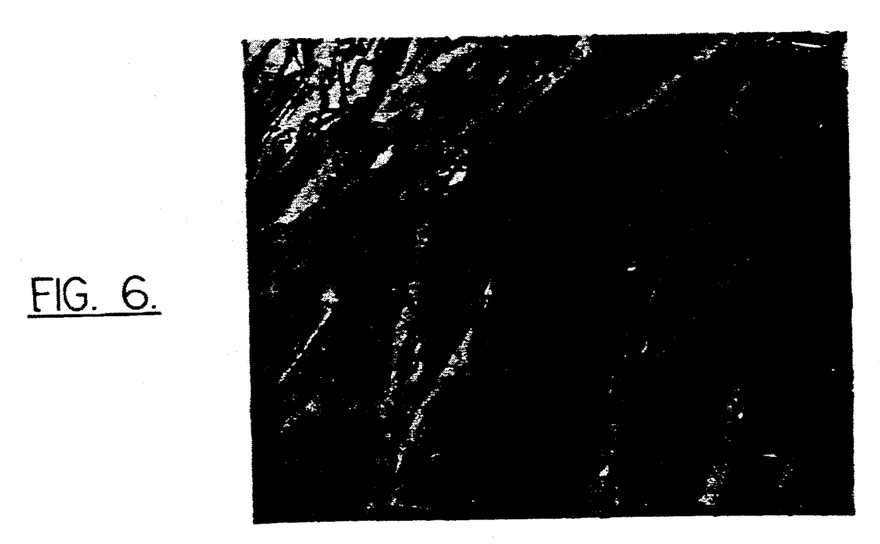
FIG. 6 is a 200× optical micrograph of the surface shown in FIG. 5 after chemical etching.

FIG. 6 shows the same surface after a KOH chemical etch, and clearly shows the stacking faults indicating successful growth of an appropriate 3C surface. The stacking faults appear as the straight dark lines that intersect each other at complimentary angles of 60° and 120°. Triangular etch pits were also observable, although not visible in the particular view of FIG. 6. The heavier, more ragged lines are double positioning boundaries (DPBs). A comparison of FIG. 4 and FIG. 6 demonstrates the absence of 6H silicon carbide in the 3C film of FIG. 6.

FIG. 7 is an optical micrograph of a 6H silicon carbide surface after incorporating the invention step of increasing the average height and separation between surface steps on the exposed (0001) surface of a 6H silicon carbide substrate. The clearly visible lines represent relatively large steps that are relatively far apart and which indicate that the surface has been appropriately prepared for growth of beta silicon carbide thereon. In preparing the surface photographed in FIG. 7, the step of increasing the average height of and separation between the steps was accomplished using the sublimation growth technique described earlier in which additional alpha silicon carbide is added to the substrate surface.

Figure 8:
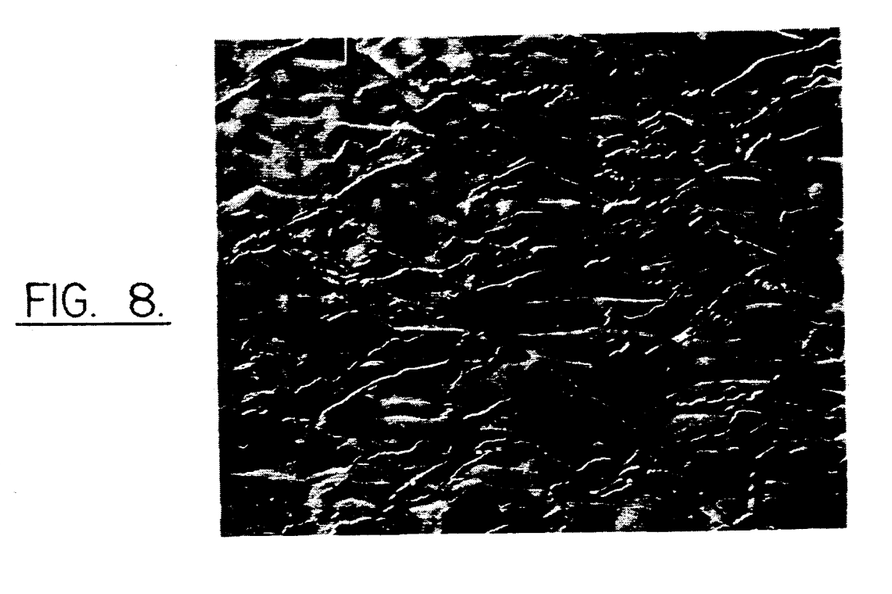
FIG. 8 is another 100× optical micrograph of the surface morphology of a beta-SiC film grown on the (0001) Si face of a 6H-SiC substrate using the present invention.
Figure 9:
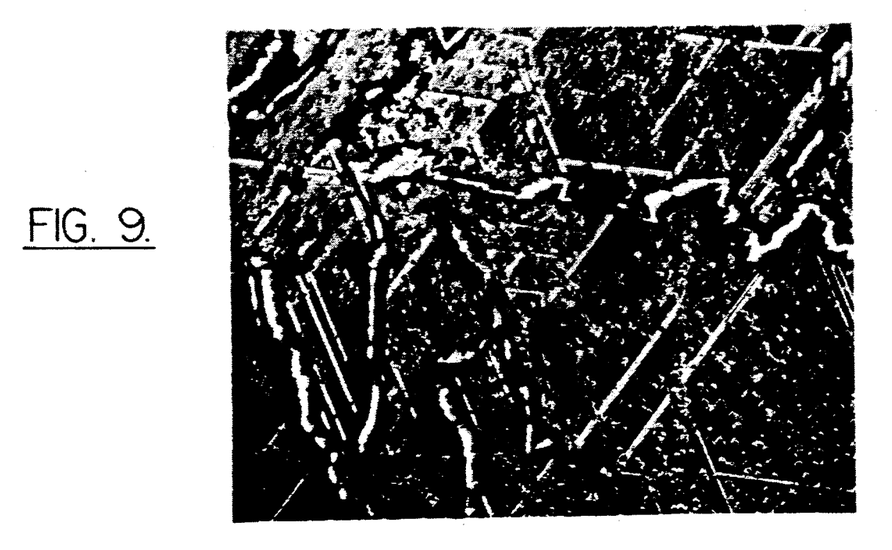
FIG. 9 is a 400× optical micrograph of the surface of FIG. 8 following chemical etching.

FIGS. 8 and 9 show a beta silicon carbide layer grown on a 6H alpha silicon carbide substrate prepared in the method that resulted in the micrograph of FIG. 7. As in the previous sets of photographs, FIG. 8 shows the surface as grown, while FIG. 9 shows it more clearly delineated after an etch in molten KOH. As in some of the previous figures, the presence of straight lines intersecting each other at complimentary angles of 60° and 120° demonstrates the presence of beta silicon carbide, while the larger, more irregular lines, show double positioning boundaries. FIG. 9 also shows a plurality of triangular pits that appear after the etching step, but these likewise demonstrate the success of the invention because their triangular appearance indicates that they are formed in 3C silicon carbide.

Figure 10:
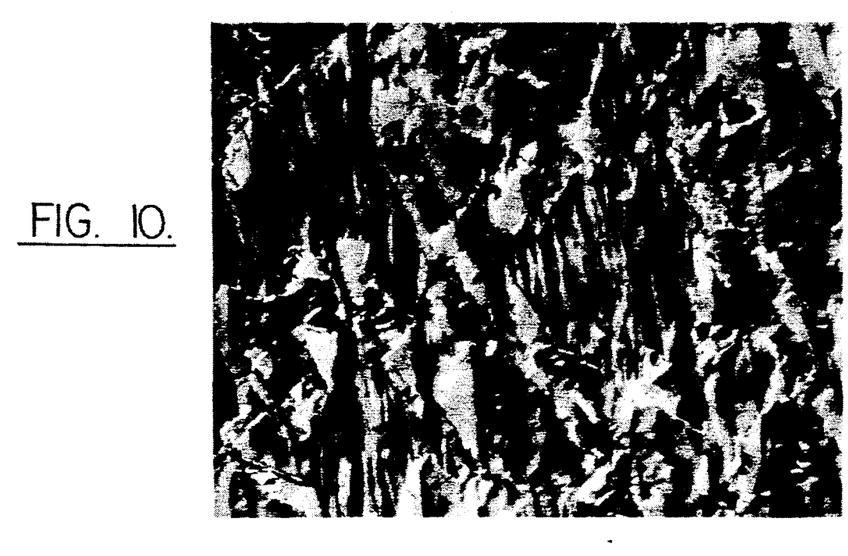
FIG. 10 is a 100× optical micrograph of the surface morphology of a beta-SiC thin grown on a (0001) Si face of a 6H-SiC substrate incorporating the method of the present invention.
Figure 11:
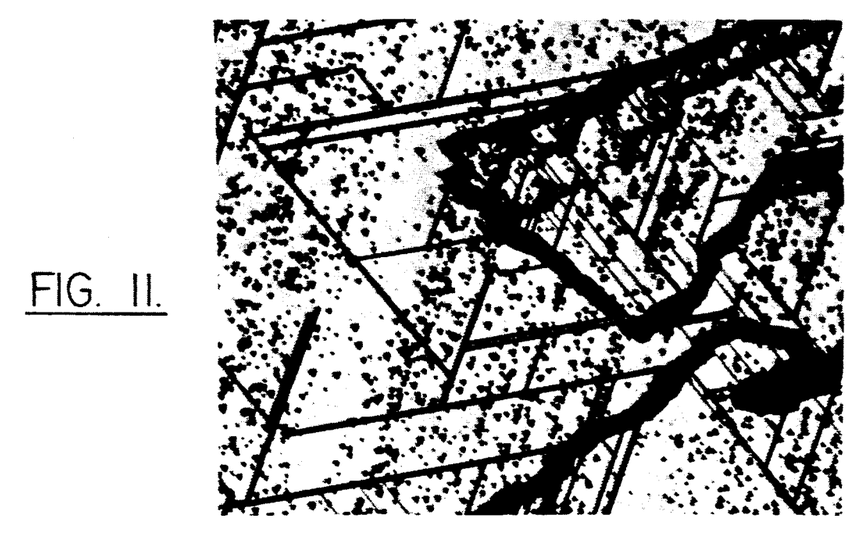
FIG. 11 is a 400× optical micrograph of the surface of FIG. 10 following chemical etching.

FIGS. 10 and 11 are micrographs of a beta silicon carbide surface grown on an alpha silicon carbide 6H surface that has been treated with both the step poisoning and step bunching procedures, and before and after a molten salt etch respectively. FIG. 11 has a more anomalous appearance than some of the other micrographs, but still demonstrates the presence of beta silicon carbide in the substantial absence of alpha silicon carbide.

Although the specific examples described herein demonstrate chemical vapor deposition growth on 6H silicon carbide, it will be understood that the invention is equally applicable to other types of epitaxial growth techniques, and for other alpha polytypes besides 6H. The invention applies to other growth techniques because the fundamental processes of crystal growth—and particularly the effects of steps and kinks—are very similar regardless of the manner used to introduce new atoms into a growing crystal. In a corresponding manner, because all alpha polytypes have a characteristic hexagonal lattice structure, the invention improves a mechanically prepared face presented for growth regardless of the variation of hexagonal stacking.

It will thus be understood, that the invention further comprises a surface of alpha silicon carbide that encourages the growth of beta silicon carbide thereon under growth conditions for which beta silicon carbide is favored. The surface comprises a mechanically prepared (0001) surface of 6H silicon carbide and a plurality of atoms other than silicon or carbon occupying otherwise vacant lattice positions on the (0001) surface for preventing the vacant lattice positions from fostering the repetitive growth of alpha silicon carbide thereat. As stated earlier, in a preferred embodiment the mechanically prepared surface of alpha silicon carbide comprises a substrate wafer that has been sliced from a bulk crystal of alpha silicon carbide.

As a further product embodiment, the invention comprises a device precursor for devices formed in beta silicon carbide which comprises a single crystal substrate of alpha silicon carbide having a mechanically prepared (0001) surface, a plurality of atoms other than silicon or carbon occupying otherwise vacant lattice positions along the (0001) surface for preventing the vacant lattice positions from fostering the repetitive growth of alpha silicon carbide thereat, and an epitaxial layer of beta silicon carbide on the (0001) surface of the alpha silicon carbide substrate.

In a most preferred embodiment, the beta silicon carbide thin film is epitaxially deposited in the [111] growth direction on the (0001) Si face of the 6H silicon carbide substrate such that the {111} crystallography of the beta silicon carbide thin film matches the [0001] crystallography of the 6H substrate and such that the beta silicon carbide (101) face is parallel to the 6H silicon carbide (11$\bar{2}$0) face and the beta silicon carbide (111) face is parallel to the 6H (0001) face.

In the drawings and specification, there have been disclosed typical preferred embodiments of the invention, and, although specific terms have been employed, they have been used in a generic and descriptive sense only and not for purposes of limitation, the scope of the invention being set forth in the following claims.

That which is claimed is:

1. A method of improving a surface of alpha silicon carbide for the growth thereon of a beta silicon carbide epitaxial layer, the method comprising:

mechanically preparing the surface of a {0001} plane of an alpha silicon carbide substrate; and thereafter introducing atoms selected from the group consisting of aluminum, gallium and phosphorous into vacant lattice positions along the mechanically prepared surface to thereby prevent the vacant lattice positions from encouraging the repetitive growth of 6H silicon carbide at those lattice positions so that chemical vapor deposition conditions that are otherwise favorable for epitaxial growth of beta silicon carbide upon the basal plane will result in such growth of beta silicon carbide upon the mechanically prepared alpha silicon carbide substrate.

2. A method of growing epitaxial layers of beta silicon carbide on non-natural surfaces of alpha silicon carbide, the method comprising:

separating a bulk single crystal of 6H silicon carbide into a substrate crystal with at least one of the {0001} surfaces thereof exposed;

introducing atoms other than silicon or carbon lattice positions along the {0001} surface of the 6H silicon carbide substrate to thereby prevent the vacant lattice positions from encouraging the repetitive growth of 6H silicon carbide at those lattice positions; and exposing the {0001}6H surface to carbon containing and silicon containing species under conditions for which the growth of beta silicon carbide is thermodynamically favored for a time sufficient for a desired epitaxial layer of beta silicon carbide to form upon the {0001} surface of the silicon carbide substrate.

3. A method according to claim 2 wherein the step of exposing the {0001} surface to carbon containing and silicon containing species comprises exposing the (0001) face of the substrate so that a beta silicon carbide thin film is deposited in the growth direction on the (0001) surface such that the (111) crystallography of the beta silicon carbide thin film matches the (0001) surface of the substrate and such that the beta silicon carbide (101) face is parallel to the alpha silicon carbide (1120) face and the beta silicon carbide (111) face is parallel to the alpha silicon carbide (0001) face.

4. A method according to claim 2 wherein the step of separating a bulk crystal comprises slicing a bulk crystal into individual wafers and polishing the exposed surface.

* * * * *

UNITED STATES PATENT AND TRADEMARK OFFICE
CERTIFICATE OF CORRECTION

PATENT NO. : 5,200,022
DATED : April 6, 1993
INVENTOR(S) : Kong et al.

It is certified that error appears in the above-identified patent and that said Letters Patent is hereby corrected as shown below:

ON THE TITLE PAGE, ITEM [56]:
UNDER "REFERENCES CITED":

Under "Other Publications", page 1, column 2, the PTO combined two Kong, et al. publications Under "Other Publications", page 2, column 2, "S 345" should be -- S 354 --

At column 1, line 10, "was" should be -- has --

At column 4, line 48, after "is" insert -- a --

At column 5, line 32, "B, or C" should be -- A, B, or C --

At column 5, line 59, after "to" (first occurrence) insert -- C; --

At column 7, line 39, "(1120)" should be -- (11$\bar{2}$0) --

At column 10, line 50, "FIGS." should be -- figures --

At column 10, line 64, "complimentary" should be -- complementary --

At column 11, lines 13 and 41, "complimentary" should be -- complementary --

At column 12, line 4, omit the comma after "understood"

At column 12, line 32, "{111}" should be -- [111] --

UNITED STATES PATENT AND TRADEMARK OFFICE
CERTIFICATE OF CORRECTION

PATENT NO. : 5,200,022
DATED : April 6, 1993
INVENTOR(S) : Kong et al.

It is certified that error appears in the above-identified patent and that said Letters Patent is hereby corrected as shown below:

At column 12, line 67, after "carbon" insert -- into vacant

At column 14, line 6, "(1120)" should be -- ($11\bar{2}0$) --

Signed and Sealed this

Eleventh Day of January, 1994

Attest:

BRUCE LEHMAN

*Attesting Officer*   *Commissioner of Patents and Trademarks*